US006793795B1

(12) United States Patent
Meyer et al.

(10) Patent No.: US 6,793,795 B1
(45) Date of Patent: Sep. 21, 2004

(54) METHOD FOR GALVANICALLY FORMING CONDUCTOR STRUCTURES OF HIGH-PURITY COPPER IN THE PRODUCTION OF INTEGRATED CIRCUITS

(75) Inventors: Heinrich Meyer, Berlin (DE); Andreas Thies, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/831,763

(22) PCT Filed: Jan. 11, 2000

(86) PCT No.: PCT/DE00/00133

§ 371 (c)(1),
(2), (4) Date: May 11, 2001

(87) PCT Pub. No.: WO00/44042

PCT Pub. Date: Jul. 27, 2000

(30) Foreign Application Priority Data

Jan. 21, 1999 (DE) .......................................... 199 03 178
Mar. 26, 1999 (DE) .......................................... 199 15 146

(51) Int. Cl.$^7$ ............................. C25D 21/18; C25D 5/18
(52) U.S. Cl. ....................... 205/101; 205/103; 205/104; 205/123; 205/157; 205/221
(58) Field of Search ................................. 205/101, 102, 205/103, 104, 118, 122, 123, 157, 183, 220, 221, 291, 292

(56) References Cited

U.S. PATENT DOCUMENTS

| 4,666,567 | A | * | 5/1987 | Loch | ............................. | 205/83 |
| 5,893,966 | A | * | 4/1999 | Akram et al. | ................ | 205/137 |
| 5,976,341 | A | * | 11/1999 | Schumacher et al. | ....... | 205/101 |
| 6,099,711 | A | * | 8/2000 | Dahms et al. | ............... | 205/101 |
| 6,261,433 | B1 | * | 7/2001 | Landau | ......................... | 205/96 |
| 6,596,148 | B1 | * | 7/2003 | Belongia et al. | .............. | 205/99 |
| 2002/0074233 | A1 | * | 6/2002 | Ritzdorf et al. | ............. | 205/157 |

FOREIGN PATENT DOCUMENTS

| DE | 4344387 A1 | * | 6/1995 | ............ | C25D/3/02 |
| DE | 195 45 231 A1 | | 5/1997 | | |
| GB | 2214520 A | * | 9/1989 | ............ | C25D/5/18 |

OTHER PUBLICATIONS

Choi et al., "Latent Iron in Silicon," Jpn. J. Appl. Phys., vol. 40 (2001), pp. L915–L917.*

Istratov et al., "Iron and its complexes in silicon," Appl. Phys. A 69 (1999), pp. 13–44.*

Istratov et al., "Iron contamination in silicon technology," Appl. Phys. A 70 (2000), pp. 489–534.*

(List continued on next page.)

Primary Examiner—Nam Nguyen
Assistant Examiner—Brian L. Mutschler
(74) Attorney, Agent, or Firm—Paul & Paul

(57) ABSTRACT

A method is disclosed for electrolytically forming conductor structures from highly pure copper on surfaces of semiconductor substrates, which surfaces are provided with recesses, when producing integrated circuits. The method includes the steps of coating the surfaces of the semiconductor substrates with a full-surface basic metal layer in order to achieve sufficient conductance for the electrolytic depositions, depositing full-surface deposition of copper layers of uniform layer thickness on the basic metal layer by an electrolytic metal deposition method, and structuring the copper layer. The electrolytic metal deposition method is accomplished by bringing the semiconductor substrates into contact with a copper deposition bath containing at least one copper ion source, at least one additive compound for controlling the physico-mechanical properties of the copper layers, and Fe(II) and/or Fe(III) compounds, and applying an electric voltage between the semiconductor substrates and dimensionally stable counter-electrodes.

9 Claims, 1 Drawing Sheet

OTHER PUBLICATIONS

J.W. Chang, P.C. Andricacos, B. Petek and L.T. Romankiw Electrodeposition of High M, CoFeCu Alloys For Recording Heads 1991, pp. 275–287 IBM Research Division, T.J. Watson Research Center.

L.T. Romankiw pH Changes at the Cathode During Electrolysis of Ni, Fe, Cu and Their Alloys and a Simple Technique for Measuring pH Changes at the Electrodes 1987, pp. 301–325 IBM, T.J. Watson Research Center.

P.C. Andricacos, C Uzoh, J.O. Dukovic, J. Horkans, H. Deligianni IBM Journal of Research and Development vol. 42 Sep. 1998, pp. 567–574.

Linda Geppert Solid State Jan. 1998, pp. 23–28.

A. Riesenkampf, et al. Studies on the Preparation and Properties of Electrodeposited Nickel–Iron and Nickel–Cobalt Magnetic Films 1975, pp. 377–386.

* cited by examiner 2.5 Adm⁻²              4.0 Adm⁻²

METHOD FOR GALVANICALLY FORMING CONDUCTOR STRUCTURES OF HIGH-PURITY COPPER IN THE PRODUCTION OF INTEGRATED CIRCUITS

CROSS-REFERENCE TO RELATED APPLICATIONS

This application is a national phase under 35 U.S.C. 371 of International application PCT/DE00/00133 filed on Jan. 11, 2000.

BACKGROUND OF THE INVENTION

1. Field of the Invention

The invention relates to a method of electrolytically forming conductor structures from highly pure copper, for example conductor paths, through-holes, connection contactings and connection places, on surfaces of semiconductor substrates (wafers), which surfaces are provided with recesses, when producing integrated circuits, more especially in cases where the recesses have a high aspect ratio.

2. Description of Related Art

To produce integrated circuits, the so-called silicon planar technique is used, wherein epitaxy and doping methods are employed. For such purpose, monocrystaline silicon discs, so-called wafers, are processed by physical methods in order to form variably conductive regions on the silicon surface in the micrometer range and, for some time, also in the sub-micrometer range (presently 0.25 μm).

The production process can be divided into three steps:

(a) production of transistors and mutual oxidation thereof; this process is also called FEOL (Front End of Line) ("Technologie hochintegrierter Schaltungen", D. Widmann, H. Mader, H. Friedrich, 2nd Edition, Springer-Verlag, 1996; "VLSI-Electronic Microstructure Science", Norman G. Einspruch, Editor, more esp. Vol. 19 "Advanced CMOS Technology", J. M. Pimbley, M. Ghezzo, H. G. Parks, D. M. Brown, Academic Press, New York, 1989);

(b) contacting and connection of the individual mono- and polycrystalline silicon regions of the FOEL part according to the desired integrated circuit;

(c) passivation or protection against mechanical damage or against the penetration of foreign substances.

In the second step, the transistors are generally contacted by multilayer metallisation and interconnected, the dielectric silicon dioxide being usually used for isolating the conductor tracks formed therefor.

To produce the conductor paths, the connection contacting holes and the connection places, an aluminium layer, having a thickness generally of 1 μm, has been applied for a long time by physical methods, for example a vaporisation method (electron beam evaporation method) or a sputtering method. Said layer is subsequently structured by suitable etching methods using a photoresist.

Aluminium is described, in older literature, as the most advantageous alternative of the materials available for producing conductor paths, connection contactings and connection places. For example, demands on this layer are described in "Integrierte Bipolarschaltungen" by H.-M. Rein and R. Ranfft, Springer-Verlag, Berlin, 1980. The problems mentioned there are in fact minimised by specific method optimisations, but they cannot be completely avoided.

More recently, it has been possible to replace aluminium by electrolytically deposited copper (IEEE-Spektrum, Jan. 1998, Linda Geppert, "Solid State", Pages 23 to 28).

Because of the greater electrical conductance, the greater thermal resistance and the resistance to diffusion and migration, more especially, copper has proved to be an alternative to aluminium as the preferred material. For such purpose, the so-called "Damascene" technique is employed (IEEE-Spektrum, Jan. 1998, Linda Geppert, "Solid State", Pages 23 to 28, and P. C. Andricacos et al. in IBM J. Res. Developm., Vol. 42. Pages 567 to 574). For such purpose, a dielectric layer is initially applied to the semiconductor substrate. The required vias and trenches are etched to receive the desired conductor structures, usually by a dry-etching method. After a diffusion barrier (mainly titanium nitride, tantalum or tantalum nitride) and a conductive layer (mainly sputtered copper) have been applied, the recesses, i.e. the vias and trenches, are electrolytically filled by the so-called trench-filling process. Since, in such case, the copper is deposited over the entire surface, the excess at the undesired locations has to be subsequently removed again. This happens with the so-called CMP process (Chemico-mechanical polishing). Multilayer circuits can be produced by repeating the process, i.e. repeated application of the dielectric (for example of silicon dioxide) and formation of the recesses by etching.

The technical demands on the electrolytic copper deposition process are given hereinafter:

(a) Constant layer thickness over the entire wafer surface (planarity); the smaller the deviations from the intended layer thickness, the easier is the subsequent CMP process;

(b) Reliable trench-filling, even of very deep trenches, with a high aspect ratio; in the future, aspect ratios of 1:10 are expected;

(c) Greatest possible electrical conductance and, hence, automatically the greatest purity of the deposited copper; for example, it is necessary for the sum of all of the impurities in the copper layer to be less than 100 ppm (0.01% by wt.).

It has become apparent that this technique for producing the conductor paths, connection contactings and connection places presents advantages over the aluminium used hitherto. However, disadvantages have now also become apparent when using the plating method of prior art, and such disadvantages lead to a reduction in the yield or, at least, to high costs for the production:

(a) When soluble anodes are used, it is disadvantageous for the geometry of the anodes to change slowly during the deposition process, since the anodes dissolve during the deposition process, with the result that it is impossible to achieve any dimensional stability and, hence, also any constant field line distribution between the anodes and the wafers. In order to overcome this problem, at least partially, inert containers for chunky anode material are in fact used, so that the dimensions of the anodes do not vary too much during the deposition process, and dissolved anodes can be replaced again relatively easily. While these so-called anode baskets are being supplemented with fresh anode material, however, the deposition process has to be stopped, so that, when the process is started-up afresh, only test samples can initially be processed because of the resultant changes in the bath, in order to achieve constant stationary conditions of the process again. Moreover, each change of anode leads to a contamination of the bath because of impurities being separated from the anodes (anode slime). Also, in consequence, a longer start-up time is required after the topping-up of anodes.

(b) Moreover, copper which is dissolved in the bath weakens during the copper deposition. If copper salts are then supplemented in the bath, this leads to a variable content of copper in the solution. In turn, in order to keep such content constant, considerable outlay in respect of control engineering has to be involved.

(c) Furthermore, when insoluble anodes are used, there is a risk of gases being developed at the anodes. During the deposition process, these gases separate from the anodes, which are usually kept horizontal, and rise upwardly in the deposition solution. There, they encounter the wafers, which are also usually kept horizontal and are situated opposite the anode, and they precipitate on the lower surface of said wafers. The locations on the wafer surface, on which the gas bubbles settle, are screened from the homogeneous electrical field in the bath, so that no copper deposition can occur there. The regions which are disturbed in such manner may lead to the wafer or at least parts of the wafer being rejected.

(d) Moreover, insoluble anodes are destroyed when pulse techniques are used, because the noble metal coatings are dissolved.

(e) Furthermore, no phase boundaries are allowed to form in the copper-filled recesses because of a copper layer, which grows from the base of the recesses and/or the lateral faces, or even cavities in the copper. This has been described, for example, by P. C. Andricacos et al., ibid. An improvement was achieved there by adding additives to the deposition bath, which additives serve to improve the layer properties.

(f) An additional substantial disadvantage resides in the fact that the applied copper layer has to be very flat. Since the copper layer is formed both in the recesses and on the raised locations of the wafer, a copper layer is produced, which has a very non-uniform thickness. When the Damascene technique is used, the surface is smoothed by the CMP method. In such case, the increased polishing rate (dishing) over the structures (trenches and vias) can be disadvantageous. The best result in the publication by P. C. Andricacos et al., ibid is shown by a copper layer where there is another slight indentation over the recesses. This indentation also leads to problems during polishing.

SUMMARY OF THE INVENTION

In consequence, the basic object of the present invention is to avoid the disadvantages of known methods and, more especially, to minimise the increased contamination of the copper coatings obtained when the more advantageous insoluble anodes are used. Moreover, it is desirable to prevent electrolyte inclusions from forming in the copper structure when forming the copper structures in recesses having a large aspect ratio. Furthermore, the problems which result from supplementing the copper salts in the deposition solution are to be solved. It is also very important to overcome the dishing problem.

These problems are solved by the method according to the present invention.

The invention relates to a method of electrolytically forming conductor structures from highly pure copper on surfaces of semiconductor substrates (wafers), which surfaces are provided with recesses, when producing integrated circuits. The method according to the present invention includes the following method steps: a. coating the surfaces of the semiconductor substrates, which are provided with the recesses, with a full-surface basic metal layer in order to achieve sufficient conductance for the electrolytic deposition; b. full-surface deposition of copper layers, of uniform layer thickness, on the basic metal layer by an electrolytic metal deposition method by bringing the semiconductor substrates into contact with a copper deposition bath, the copper deposition bath containing at least one copper ion source, at least one additive compound for controlling the physico-mechanical properties of the copper layers as well as Fe(II) and/or Fe(III) compounds, and an electric voltage being applied between the semiconductor substrates and dimensionally stable counter-electrodes, which are insoluble in the bath and are brought into contact therewith, so that an electric current flows between the semiconductor substrates and the counter-electrodes; c. structuring the copper layer.

DETAILED DESCRIPTION OF THE INVENTION

Figure 1:
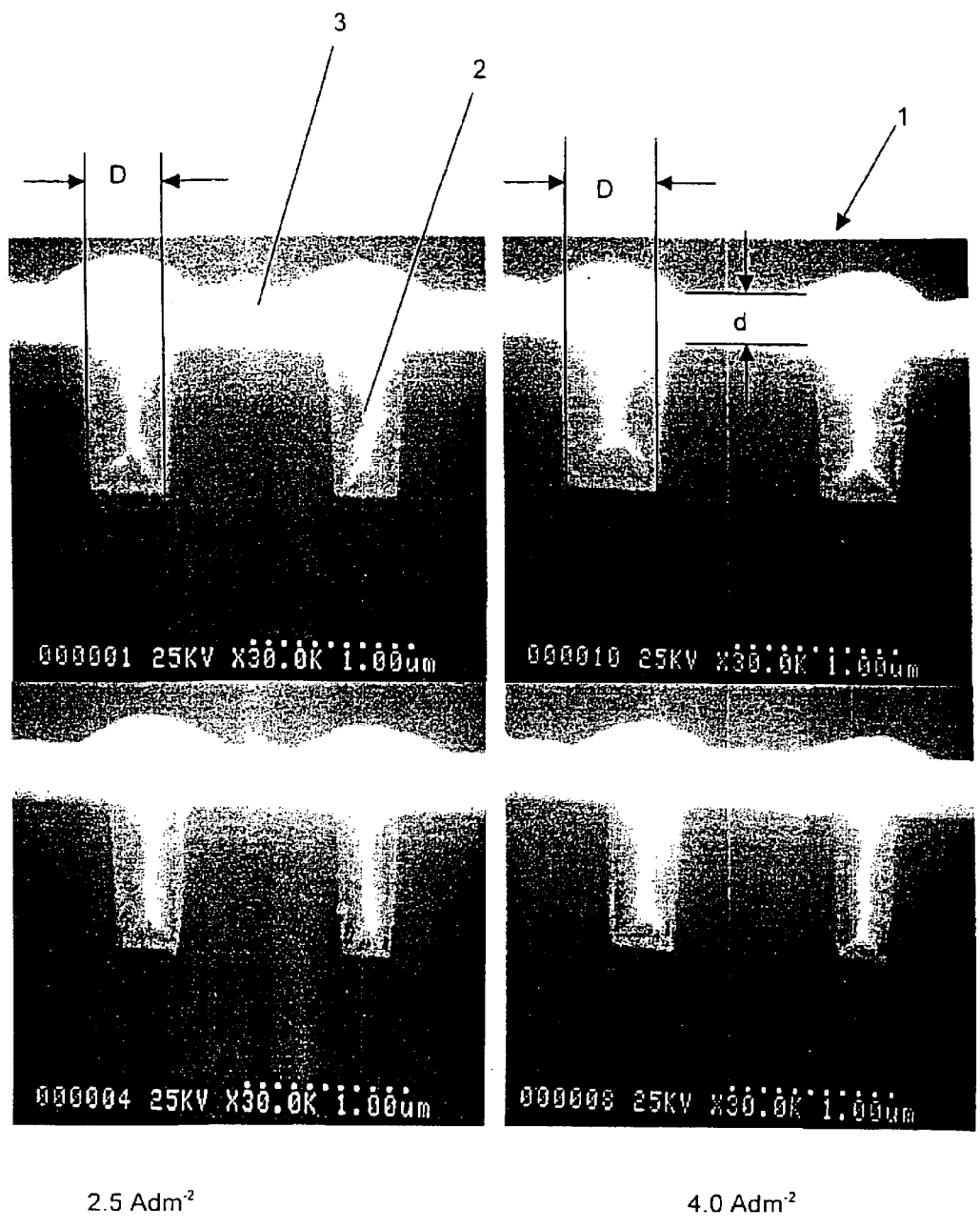
FIG. 1 shows cross sections through a wafer having a copper coating resulting from a method according to the present invention.

The method, according to the invention, for electrolytically forming conductor structures from highly pure copper on the semiconductor substrates (wafers) when producing integrated circuits includes the following essential method steps:

a. filling the recesses, situated on the surfaces of the wafers, with a full-surface basic metal layer, preferably having a thickness of between 0.02 μm and 0.3 μm, to produce sufficient conductance (plating base), a physical metal deposition method and/or a CVD method and/or a PECVD method preferably being used;

b. full-surface deposition of copper layers with a uniform layer thickness on the basic metal layer by an electrolytic metal deposition method in a copper deposition bath, i. the copper deposition bath containing at least one copper ion source, at least one additive compound for controlling the physico-mechanical properties of the copper layers as well as Fe(II) and/or Fe(III) compounds, and ii. an electric voltage being applied between the wafers and dimensionally stable counter-electrodes, which are insoluble in the bath and brought into contact therewith, so that an electric current flows between the wafers and the counter-electrodes, and the electric voltage and the flowing current either being constant or being changed per unit time in the form of uni- or bipolar pulses;

c. structuring the copper layer, preferably by a CMP method.

With the method according to the invention, it is possible for the first time to avoid the disadvantages of the various known method variants for producing integrated circuits.

It was surprisingly found that, by adding Fe(II)/Fe(III) compounds, not only can the above-mentioned disadvantages (a) to (d)—as described in DE 195 45 231 A1 for use in printed circuit board technology—be overcome, but that, contrary to every expectation, the purity of the copper layers is also excellent and that, more especially, no iron is incorporated in the copper, so that the deposited copper meets all specifications, more especially also the demand for good trench-filling, a phenomenon for which there is hitherto no plausible scientific explanation. The observation that even a somewhat thicker metal layer was formed over the recesses than was formed over the raised structures was particularly surprising, so that the disadvantageous effect of "dishing" is compensated-for.

The advantages in detail:

(a) Contrary to all expectation, it was ascertained that the degree of contamination of the copper structures produced when dimensionally stable, insoluble anodes are used can be clearly reduced, although additional ingredients, namely iron salts, are added to the deposition bath. Typically, the copper only contains at most 10 ppm iron. The result which was found is contrary to the expectation that, by adding additional substances to the deposition bath, even more strongly contaminated coatings are usually obtained. In consequence, there was hitherto the demand to use chemicals which are as pure as possible for producing integrated circuits. Generally, in fact, the basic concept is that highly pure chemicals should be used exclusively for producing integrated circuits in order to prevent contaminations of the most highly sensitive silicon. This requirement is based on the fact that the degree of contamination of the electrical regions in an integrated circuit is greater when the degree of contamination of the chemicals used to produce the circuit is greater. Contamination of the electrical regions in the silicon is to be avoided in any case since, even with the slightest impurity of these regions, disadvantageous consequences and probably even a total failure of the circuit are to be feared.

Compared with production techniques for integrated circuits, not nearly such high requirements for the purity of the copper layer are made in printed circuit board technology. In consequence, the use of iron salts in this case could be accepted without any problems.

Furthermore, it is known that iron from plating baths for depositing copper alloys; which contain iron, is also deposited as alloy metal. For example, in "Electrodeposition of high Ms cobalt-iron-copper alloys for recording heads", J. W. Chang, P. C. Andricacos, B. Petek, L. T. Romankiw, Proc. —Electrochem. Soc. (1992), 92–10 (Proc. Int. Symp. Magn. Mater. Processes, Devices, $2^{nd}$, 1991), Pages 275 to 287, for the deposition of an alloy, containing copper and iron, it is described that a content of iron in the deposition bath (15 g/l $FeSO_4 \cdot 7 H_2O$), which substantially corresponds to the iron content in the copper deposition bath according to the invention, leads to a considerable iron content in the alloy. Reference is also made to the electrolytic deposition of iron-containing alloys in other publications, for example in "pH-changes at the cathode during electrolysis of nickel, iron, and copper and their alloys and a simple technique for measuring pH changes at electrodes", L. T. Romankiw, Proc. —Electrochem. Soc. (1987), 87–17 (Proc. Symp. Electrodeposition Technol., Theory Pract.), 301–25.

(b) A very uniform copper layer thickness at all locations of the wafer is also achieved.

Recesses with a usually very small width, or respectively with a very small diameter, are very rapidly completely filled with metal. A somewhat greater thickness of the metal is even achieved over such recesses than is achieved over the raised structures. In consequence, the outlay for the subsequent polishing by the CMP method is not very great. The recesses generally have a width or a diameter of between 0.15 µm and 0.5 µm. The depth thereof is usually substantially 1 µm.

Contrary to known methods, the copper layers obtained by a production according to the method of the invention are equally thick at the leading edges to the recesses to be metallised as at the lateral walls and at the base of the recesses in the case where recesses have greater lateral dimensions. The copper layer largely follows the surface contour of the wafer surface. The disadvantage is thus avoided, where the cross-section of the recesses at the upper edge is already completely filled with copper, while deposition solution is still situated in the lower region of the recesses. The problems which arise with such an inclusion of electrolyte, for example an explosion-like escape of the included fluid during heating of the circuit, diffusion of impurities through the copper, are thus completely avoided. A metal structure is obtained, which is uniformly filled with copper and meets the usual requirements which exist for the production of integrated circuits.

(c) Furthermore, the disadvantages which arise when soluble (copper) anodes are used can be avoided. A reproducible field line distribution within the deposition bath is achieved, more especially. However, the geometry of soluble anodes constantly changes because of the dissolution, so that no time-stable field line distribution can be obtained, at least in the outer region of the wafers situated opposite the anodes. By using the dimensionally stable anodes, therefore, it is now possible to produce even greater wafers than hitherto.

The problems which occur when supplementing used anode material (contamination of the bath by anode slime and by other impurities, operational interruptions by disconnection of the bath and renewed starting and charging of the bath) can also be avoided when insoluble anodes are used.

(d) It is also surprising that, with the method according to the invention, recesses having very high aspect ratios can easily be filled with copper without gas or liquid inclusions being formed in the copper conductor track. A scientific explanation for this phenomenon had hitherto not yet been found.

It was also observed that many electrolytes have a surprisingly good trench-filling behaviour, while such a result could not be achieved with other electrolytes.

A pulse current or pulse voltage method is preferably used. In the pulse current method, the current between the workpieces, polarized as the cathode, and the anodes is set galvanostatically and modulated per unit time by suitable means. In the pulse voltage method, a voltage between the wafers and the counter-electrodes (anodes) is set potentiostatically, and the voltage is modulated per unit time so that a current is set which is variable per unit time.

The method, which is known from technology as the reverse pulse method, is preferably used with bipolar pulses. Those methods are especially suitable, in which the bipolar pulses comprise a sequence of cathodic pulses, lasting from 20 milliseconds to 100 milliseconds, and anodic pulses lasting from 0.3 milliseconds to 10 milliseconds. In a preferred use, the peak current of the anodic pulses is set to at least the same value as the peak current of the cathodic pulses. The peak current of the anodic pulses is preferably set two to three times as high as the peak current of the cathodic pulses. (e) Gas bubbles are also prevented from developing on the insoluble anodes. The problems, which arise when known methods are used with the precipitation of these gas bubbles on the wafers situated opposite the anodes, are avoided because water is not decomposed as the anode reaction according to

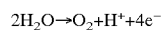

but the reaction

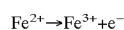

occurs. In consequence, an electric screening of individual regions on the wafer surfaces does not occur during the copper deposition, so that an improved yield is achieved as a general rule during the production of the integrated circuits. Furthermore, less electrical energy is also required.

According to the invention, a method of producing a full-surface, highly pure copper layer on semiconductor substrates (wafers), provided with recesses, is also available, wherein the above method steps a. and b. are carried out. A structuring of the copper layer according to method step c. is omitted in this case. The above-mentioned advantages also apply to the production of a full-surface copper layer, since conductor structures can easily be produced from such layer by known methods.

Besides containing at least one copper ion source, preferably a copper salt with an inorganic or organic anion, for example copper sulphate, copper methane sulphonate, copper, pyrophosphate, copper fluoroborate or copper sulphamate, the bath used for the copper deposition additionally contains at least one substance for increasing the electrical conductance of the bath, for example sulphuric acid, methane sulphonic acid, pyrophosphoric acid, fluoroboric acid or amidosulphuric acid.

Typical concentrations of these basic ingredients are given hereinafter: copper sulphate($CuSO_4 \cdot 5 H_2O$) 20–250 g/l preferably 80–140 g/l or 180–220 g/l sulphuric acid, conc. 50–350 g/l preferably 180–280 g/l or 50–90 g/l.

The deposition solution may also contain a chloride, for example sodium chloride or hydrochloric acid. Typical concentrations thereof are given hereinafter:

chloride ions (added for example as NaCI) 0.01–0.18 g/l preferably 0.03–0.10 g/l.

Moreover, the bath according to the invention contains at least one additive compound for controlling the physicomechanical properties of the copper layers. Suitable additive compounds are, for example, polymeric oxygen-containing compounds, organic sulphur compounds, thiourea compounds and polymeric phenazonium compounds.

The additive compounds are contained in the deposition solution within the following concentration ranges:

usual polymeric oxygen-containing compounds 0.005–20 g/l preferably 0.01–5 g/l usual water-soluble organic sulphur compounds 0.0005–0.4 g/l preferably 0.001–0.15 g/l.

Some polymeric oxygen-containing compounds are listed in Table 1.

Table 1 (polymeric oxygen-containing compounds)
carboxymethyl cellulose
nonylphenol-polyglycol ether
octanediol-bis-(polyalkyleneglycol ether)
octanolpolyalkyleneglycol ether
oleic acid polyglycol ester
polyethylene-propyleneglycol
polyethyleneglycol
polyethyleneglycol-dimethylether
polyoxypropyleneglycol
polypropyleneglycol
polyvinyl alcohol
stearic acid polyglycol ester
stearyl alcohol polyglycol ether
β-naphtol polyglycol ether.

Various sulphur compounds with suitable functional groups for producing the water solubility are given in Table 2.

Table 2 (organic sulphur compounds)
3-(benzothiazolyl-2-thio)-propylsulphonic acid, sodium salt
3-mercaptopropane-1-sulphonic acid, sodium salt
ethylenedithiodipropylsulphonic acid, sodium salt
bis-(p-sulphophenyl)-disulphide, disodium salt
bis-(ω-sulphobutyl)-disulphide, disodium salt
bis-(ω-sulphohydroxypropyl)-disulphide, disodium salt
bis-(ω-sulphopropyl)-disulphide, disodium salt
bis-(ω-sulphopropyl)-sulphide, disodium salt
methyl-(ω-sulphopropyl)-disulphide, disodium salt
methyl-(ω-sulphopropyl)-trisulphide, disodium salt
O-ethyl-dithiocarboxylic acid-S-(ω-sulphopropyl)-ester, potassium salt
thioglycolic acid
thiophosphoric acid-O-ethyl-bis-(ω-sulphopropyl)-ester, disodium salt
thiophosphoric acid-tris-(ω-sulphopropyl)-ester, trisodium salt.

Thiourea compounds and polymeric phenazonium compounds, as the additive compounds, are used in the following concentrations:

0.0001–0.50 g/l preferably 0.0005–0.04 g/l.

In order to achieve the effects, according to the invention, when using the claimed method, Fe(II) and/or Fe(III) compounds are additionally contained in the bath. The concentration of these substances is given hereinafter:

Iron(II)-sulphate ($FeSO_4 \cdot 7 H_2O$) 1–120 g/l preferably 20–80 g/liter.

Suitable iron salts are iron(II)-sulphate-heptahydrate and iron(III)-sulphate-nonahydrate, from which the effective $Fe^{2+}/Fe^{3+}$ redox system is formed after a short operational time. These salts are mainly suitable for aqueous, acidic copper baths. Other water-soluble iron salts may also be used, for example iron perchlorate. Salts are advantageous which contain no (hard) complex formers, which are biologically non-degradable or degradable with some difficulty, since these may create problems when disposing offrinsing water (for example iron ammonium alum). Iron compounds, having anions which lead to undesirable secondary reactions in the case of the copper deposition solution, such as chloride or nitrate for example, should not be used if possible. In consequence, carboxylates of the iron, such as acetate, propionate and benzoate, as well as the hexafluorosilicates, are also advantageous.

No soluble anodes from copper are used as the anodes, but dimensionally stable, insoluble anodes are used therefor. By using the dimensionally stable, insoluble anodes, a constant spacing can be set between the anodes and the wafers. The anodes are easily adaptable to the wafers in respect of their geometrical shape and, contrary to soluble anodes, they practically do not change their geometrical external dimensions. In consequence, the spacing between the anodes and the wafers, which influences the distribution of layer thickness on the surface of the wafers, remains constant.

To produce insoluble anodes, (inert) materials which are resistant to the electrolyte are used, such as stainless steel or lead for example. Anodes are preferably used which contain titanium or tantalum as the basic material, which is preferably coated with noble metals or oxides of the noble metals. Platinum, iridium or ruthenium, as well as the oxides or mixed oxides of these metals, are used, for example, as the coating. Besides platinum, iridium and ruthenium, rhodium, palladium, osmium, silver and gold, or respectively the oxides and mixed oxides thereof, may also basically be used for the coating. A particularly high resistance to the electrolysis conditions could be observed, for example, on a titanium anode having an iridium oxide surface, which was irradiated with fine particles, spherical bodies for example, and thereby compressed in a pore-free manner. Moreover, of course, anodes may also be used, which are formed from noble metals, for example platinum, gold or rhodium or alloys of these metals. Other inert, electrically conductive materials, such as carbon (graphite), may also basically be used.

For the electrolytic copper deposition, a voltage is applied between the semiconductor substrate and the anode, the voltage being so selected that an electric current of 0.05 A to 20 A, preferably 0.2 A to 10 A and, more especially 0.5 A to 5 A, flows per $dm^2$ semiconductor substrate surface.

Since the copper ions consumed during the deposition from the deposition solution cannot be directly supplied by the anodes by dissolution, said ions are supplemented by chemically dissolving corresponding copper parts or copper-containing shaped bodies. Copper ions are formed from the copper parts or shaped bodies in a redox reaction by the oxidising effect of the Fe(III) compounds contained in the deposition solution.

To supplement the copper ions consumed by deposition, therefore, a copper ion generator is used, which contains parts of copper. To regenerate the deposition solution, which is weakened by a consumption of copper ions, said solution is guided past the anodes, whereby Fe(III) compounds are formed from the Fe(II) compounds. The solution is subsequently conducted through the copper ion generator and thereby brought into contact with the copper parts. The Fe(III) compounds thereby react with the copper parts to form copper ions, i.e. the copper parts dissolve. The Fe(III) compounds are simultaneously converted into the Fe(II) compounds. Because of the formation of the copper ions, the total concentration of the copper ions contained in the deposition solution is kept constant. The deposition solution passes from the copper ion generator back again into the electrolyte chamber which is in contact with the wafers and the anodes.

Because of this special technique, the concentration of the copper ions in the deposition solution can be kept constant very easily.

The wafers are usually kept horizontal for the copper deposition. Care should be taken there to ensure that the rear side of the wafer does not come into contact with the deposition solution. Anodes in the deposition bath, also kept horizontal, are disposed directly opposite the wafers.

The method according to the invention is especially suitable for forming conductor paths, connection contactings and connection places in recesses situated on the surfaces of wafers. The surfaces of the wafers are usually formed from silicon dioxide prior to the formation of these metallic structures. To produce the conductor paths and connection contactings, copper is deposited therefor in trench-like recesses or in recesses configured as a blind-hole.

In order to permit a copper layer to be electrolytically deposited on the dielectric surface of the silicon dioxide layer, said layer must initially be made electrically conductive. Moreover, suitable measures must be taken to prevent the diffusion of copper atoms into the silicon situated therebeneath.

In order to produce a diffusion barrier between the copper layer and silicon, therefore, a nitride layer (tantalum nitride layer for example) is formed, for example, by a sputtering method.

The basic metal layer is subsequently produced, which forms an electrically conductive base for the subsequent electrolytic metallisation. A full-surface layer, preferably having a thickness of between 0.02 $\mu$m and 0.3 $\mu$m, is produced as the basic metal layer, preferably by a physical metal deposition method and/or by a CVD method and/or by a PECVD method. Basically, however, a plating method may also be used, for example an electroless metal deposition method. A basic metal layer, formed from copper, may be deposited for example. Other conductive layers, preferably metal layers, are also suitable.

The copper layer, having a thickness of substantially 1 $\mu$m, is then electrolytically deposited according to the above-described method. This layer may also, of course, be thinner or thicker, from 0.2 $\mu$m to 5 $\mu$m for example.

After the formation of this copper layer, the structure of the conductor paths, connection contactings and connection places is transformed. Usual structuring methods may be used therefor. For example, the formed copper layer may be coated with a resist layer and subsequently be exposed again, by removal of the resist layer, at the locations where no conductor paths, connection contactings or connection places are to be formed. Finally, the copper layer is removed in the exposed regions.

In the mode of operation which has become known as the "Damascene copper metallisation", copper is deposited more especially in the trench-like or via-like recesses, and the copper, which is deposited on the surface of the wafer externally of the recesses, is selectively removed by a polishing method which is based on mechanical and chemical methods (CMP methods).

One example of the method according to the invention is given hereinafter. Example:

To produce a copper layer, a wafer which is provided with recesses (trenches, vias) was initially coated with a diffusion barrier formed from tantalum nitride and subsequently coated with a copper layer, which has a thickness of substantially 0.1 $\mu$m, the barrier and layer having been formed by sputtering methods. A copper deposition bath, having the following composition, was used for the additional deposition of the copper layer by the method according to the invention:

$H_2SO_4$, 98% by wt. 230 g/l $CuSO_4 \cdot 5\ H_2O$ 138 g/l $FeSO_4 \cdot 7\ H_2O$ 65 g/l NaCl 0.8 g/l oxygen-containing polymeric wetting agents in water The copper was deposited under the following conditions:

cathodic current density 4 A/$dm^2$ circulation performance of the bath 5 I/min insoluble anodes room temperature The coating results is illustrated in FIG. 1 with reference to cross sections through the wafer 1, said wafer having recesses 2, which are filled with copper 3 and have variable width D prior to a CMP method being carried out. The surfaces of the raised locations on the wafer 1 are coated with the copper layer 3. The copper layer thickness d over the recesses 2 is surprisingly greater than over the raised locations on the wafer 1. In consequence, it is not very complex to achieve a flat surface of the wafer 1 by the CMP method.

What is claimed is:

1. Method of electrolytically forming conductor structures from highly pure copper on semiconductor substrate surfaces, provided with recesses, when producing integrated circuits with the following method steps:

a. coating the semiconductor substrate surfaces, which are provided with the recesses, with a full-surface basic metal layer in order to obtain sufficient conductance for the electrolytic deposition;

b. full-surface deposition of copper layers having a uniform layer thickness on the basic metal layer by an electrolytic metal deposition method by bringing the semiconductor substrate surfaces into contact with a copper deposition bath,
   i. the copper deposition bath containing at least one copper ion source, at least one additive compound for controlling the physico-mechanical properties of the copper layers, and Fe(II) compounds and/or Fe(III) compounds, and
   ii. an electric voltage being applied between the semiconductor substrate surfaces and dimensionally stable counter-electrodes, which are insoluble in the bath and are brought into contact therewith, so that an electric current flows between the semiconductor substrate surfaces and the counter-electrodes;

c. structuring the copper layer.

2. Method according to claim 1, wherein the current is changed with a sequence of uni- or bipolar pulses per unit time.

3. Method according to claim 2, wherein the current is changed with a sequence of bipolar pulses per unit time, comprising a sequence of cathodic pulses lasting from 20 milliseconds to 100 milliseconds and anodic pulses lasting from 0.3 milliseconds to 10 milliseconds.

4. Method according to any one of claims 2 and 3, wherein, in the case of bipolar pulses, the peak current of the anodic pulses is set to at least the same value as the peak current of the cathodic pulses.

5. Method according to any one of claims 2 and 3, wherein, in the case of bipolar pulses, the peak current of the anodic pulses is set to two to three times as high as the peak current of the cathodic pulses.

6. Method according to any one of claims 1–3, wherein at least one additive compound is used, selected from the group comprising polymeric oxygen-containing compounds, organic sulphur compounds, thiourea compounds and polymeric phenazonium compounds.

7. Method according to any one of claims 1–3, wherein inert metals, coated with noble metals or oxides of the noble metals, are used as the dimensionally stable, insoluble counter-electrodes.

8. Method according to claim 7, wherein expanded titanium metal, coated with iridium oxide and irradiated by means of fine particles, is used as the counter-electrode.

9. Method according to any one of claims 1–3, wherein the concentration of the compounds of the copper ion source in the copper deposition bath is kept constant per unit time, because copper parts or copper-containing shaped bodies are brought into contact with the copper deposition bath, and copper is dissolved by reacting with Fe(III) compounds and/or Fe(III) ions contained in the bath.

* * * * *